United States Patent
Yu et al.

(10) Patent No.: US 8,877,637 B2
(45) Date of Patent: Nov. 4, 2014

(54) DAMASCENE PROCESS FOR ALIGNING AND BONDING THROUGH-SILICON-VIA BASED 3D INTEGRATED CIRCUIT STACKS

(75) Inventors: Hong Yu, Singapore (SG); Huang Liu, Singapore (SG)

(73) Assignee: GlobalFoundries Singapore Pte. Ltd, Singapore (SG)

( * ) Notice: Subject to any disclaimer, the term of this patent is extended or adjusted under 35 U.S.C. 154(b) by 227 days.

(21) Appl. No.: 13/234,405

(22) Filed: Sep. 16, 2011

(65) Prior Publication Data

US 2013/0069232 A1    Mar. 21, 2013

(51) Int. Cl.
*H01L 21/44*    (2006.01)
*H01L 21/16*    (2006.01)
*H01L 21/30*    (2006.01)
*H01L 21/46*    (2006.01)
*H01L 25/00*    (2006.01)
*H01L 25/065*    (2006.01)
*H01L 21/768*    (2006.01)

(52) U.S. Cl.
CPC ....... *H01L 21/76898* (2013.01); *H01L 2224/16* (2013.01); *H01L 2225/06541* (2013.01); *H01L 25/50* (2013.01); *H01L 25/0657* (2013.01)
USPC ........... 438/667; 438/107; 438/118; 438/459; 438/675

(58) Field of Classification Search
None
See application file for complete search history.

(56) References Cited

U.S. PATENT DOCUMENTS

| | | | |
|---|---|---|---|
| 2008/0029850 A1* | 2/2008 | Hedler et al. | 257/621 |
| 2010/0065949 A1* | 3/2010 | Thies et al. | 257/621 |
| 2010/0182041 A1* | 7/2010 | Feng et al. | 326/38 |
| 2010/0237471 A1* | 9/2010 | Pagaila et al. | 257/621 |
| 2012/0193809 A1* | 8/2012 | Chung | 257/774 |

* cited by examiner

*Primary Examiner* — Michael Jung
(74) *Attorney, Agent, or Firm* — Ditthavong & Steiner, P.C.

(57) ABSTRACT

Through-silicon-via (TSV) based 3D integrated circuit (3D IC) stacks are aligned, bonded and electrically interconnected using a transparent alignment material in the TSVs until the wafers are bonded. Embodiments include providing a first wafer having a first device layer and at least one first TSV filled with a conductive material, providing a second wafer having a second device layer, forming at least one second TSV in the second wafer, filling each second TSV with an alignment material, thinning the second wafer until the transparent material extends all the way through the wafer, aligning the first and second wafers, bonding the first and second wafers, removing the alignment material from the second wafer, and filling each second TSV in the second wafer with a conductive material.

19 Claims, 5 Drawing Sheets

DAMASCENE PROCESS FOR ALIGNING AND BONDING THROUGH-SILICON-VIA BASED 3D INTEGRATED CIRCUIT STACKS

TECHNICAL FIELD

The present disclosure relates to a method of aligning and bonding through-silicon-via (TSV) based three-dimensional (3D) integrated circuit (IC) stacks. The present disclosure is particularly applicable to fabricating TSV based 3D IC stacks with mechanical bonding strength and electrical interconnect properties.

BACKGROUND

Recent innovations in 3D chip, die and wafer (hereinafter wafer) integration have enabled a greater miniaturization of devices as well as technological advancements in speed, density, power consumption, and cost. Further cost-effective miniaturization is presently hindered by bonding related issues affecting the manufacturability and mass production of TSV based 3D IC stacks. Current bonding processes, e.g., copper-to-copper (Cu—Cu) bonding, oxide bonding, soldering bonding, or other polymer bonding processes, fail to adequately address the industry's increasing requirements for precision alignment, bonding strength, electrical interconnection, and manufacturability.

A need therefore exists for methodology enabling the fabrication of 3D IC stacks with improved alignment, bonding strength, electrical interconnection, and manufacturability, and the resulting device.

SUMMARY

An aspect of the present disclosure is a TSV based 3D IC stack including a device layer on each wafer.

Another aspect of the present disclosure is an efficient and cost effective method of aligning and bonding multiple wafers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first wafer having first and second surfaces, a first device layer, and at least one first TSV filled with a conductive material; providing a second wafer having first and second surfaces and a second device layer on the first surface; forming at least one second TSV in the first surface of the second wafer; filling each second TSV in the second wafer with an alignment material; thinning the second surface of the second wafer; aligning the first and second wafers; bonding the first and second wafers; removing the alignment material from the second wafer; and filling each second TSV in the second wafer with a conductive material.

Aspects of the present disclosure include forming the at least one second TSV in the first surface of the second wafer by etching. Another aspect includes filling each second TSV in the second wafer with an alignment material transparent to at least one of infrared, visible, and ultraviolet (UV) light. Other aspects include filling by forming a layer of the alignment material; and chemical mechanical polishing (CMP) down to the first surface of the second wafer. Further aspects include filling by forming a layer of the alignment material; and removing by etching down to the first surface of the second wafer. Additional aspects include thinning the second surface of the second wafer until the alignment material extends all the way through the wafer. Further aspects include bonding the first and second wafers by forming an adhesive bonding layer on at least one surface of the first or second wafer. Another aspect includes aligning each first TSV in the first wafer with a corresponding second TSV filled with the transparent alignment material in the second wafer. Other aspects include removing the alignment material in the second wafer and bonding layer by etching to expose each first TSV filled with conductive material in the first wafer. Other aspects include cleaning with dilute hydrofluoric acid (dHF) each exposed TSV filled with conductive material in the first wafer subsequent to removing the alignment material and bonding layer. Additional aspects include filling each second TSV in the second wafer with copper. Further aspects include forming by electrochemical plating (ECP) a layer of conductive material on an outer surface of and in each second TSV of the second wafer. Further aspects include CMP down to the outer surface of the second wafer.

Another aspect of the present disclosure is a method including: providing a first wafer having first and second surfaces, a first device layer, and at least one first TSV filled with a conductive material; providing a second wafer having first and second surfaces, a second device layer, and at least one second TSV corresponding to the at least one first TSV of the first wafer; aligning each first TSV in the first wafer with the corresponding second TSV in the second wafer; bonding the first and second wafers; and electrically interconnecting the first and second wafers through the first and second TSVs.

Aspects of the present disclosure include providing a first wafer having at least two first TSVs filled with a conductive material and a second wafer having at least two second TSVs. Another aspect includes the at least two second TSVs are filled with an alignment material transparent to at least one of infrared, visible, and UV light, the method further including removing the transparent alignment material subsequent to bonding. Other aspects include forming an adhesive bonding layer on at least one surface of the first or second wafer. Further aspects include forming by ECP a layer of conductive material on an outer surface of and in each second TSV of the second wafer and further including removing by CMP any excess conductive material from the outer surface of the second wafer.

Another aspect of the present disclosure is a method including: providing a first wafer having first and second surfaces, a first device layer, and at least two first TSVs filled with copper; providing at least two second wafers, each having first and second surfaces and a second device layer on the first surface; etching at least two second TSVs in the first surface of each second wafer; filling each second TSV in each second wafer with an alignment material which is transparent to at least one of infrared, visible, and UV light; thinning the second surface of each second wafer until the alignment material extends all the way through the wafer; aligning the first TSVs in the first wafer with the second TSVs in one second wafer; bonding the first wafer and the one second wafer with an adhesive bonding material; etching the alignment and bonding materials through the second TSVs of the one second wafer, to expose the filled first TSVs of the first wafer; filling the second TSVs in the one second wafer with copper; and repeating for each additional second wafer the steps including: aligning the second TSVs in the bonded second wafer with the second TSVs in an additional second wafer; bonding further the bonded second wafer with the additional second wafer; etching the alignment and bonding material in the second TSVs of the additional second wafer thereby exposing the filled second TSVs of the bonded second wafer; and filling the second TSVs of the additional second wafer with copper. A further aspect includes a TSV based 3D IC stack produced by the disclosed methods.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
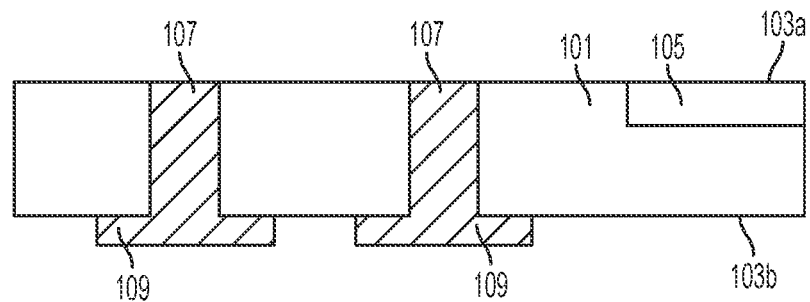
FIGS. 1 through 10B schematically illustrate sequential steps of a method in accordance with an embodiment of the present disclosure, with FIGS. 7A through 10A illustrating a face-to-back wafer configuration, and FIGS. 7B through 10B illustrating a face-to-face wafer configuration.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the alignment, bonding strength, electrical interconnection, and manufacturability related issues attendant upon current bonding processes. In accordance with embodiments of the present disclosure, a first wafer having first and second surfaces, a first device layer, and at least one first TSV filled with a conductive material is aligned, bonded, and electrically interconnected with at least one second wafer having first and second surfaces, a second device layer, and at least one second TSV filled with a conductive material in an efficient and cost-effective manner. Specifically, by filling TSVs in the second wafer with an alignment material and using the alignment material to align the TSVs in the second wafer with TSVs in the first wafer while bonding the two wafers, alignment and bonding strength may be improved. Further, by then removing the alignment material and filling the TSVs with a conductive material, electrical interconnection may be improved relative to current bonding processes.

Methodology in accordance with embodiments of the present disclosure includes providing a first wafer having first and second surfaces, a first device layer, and at least one TSV filled with a conductive material, providing a second wafer having first and second surfaces and a second device layer on the first surface, forming at least one second TSV in the first surface of the second wafer, filling each second TSV in the second wafer with an alignment material, thinning the second surface of the second wafer, aligning the first and second wafers, bonding the first and second wafers, removing the alignment material from the second wafer, and filling each second TSV in the second wafer with a conductive material.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 1, a first wafer 101 is provided with first and second surfaces 103a and 103b, respectively, a first device layer 105, e.g., a complementary metal-oxide-semiconductor (CMOS) sensor, a light emitting diode (LED), micro-electro-mechanical-systems (MEMS), or a CMOS device. First wafer 101 also has at least one TSV 107 filled with a conductive material, e.g., copper (Cu) or copper alloys. As illustrated in FIG. 1, the Cu is overburdened to create Cu extensions 109. Embodiments of the present disclosure may alternatively include TSVs without Cu extensions.

Figure 2:
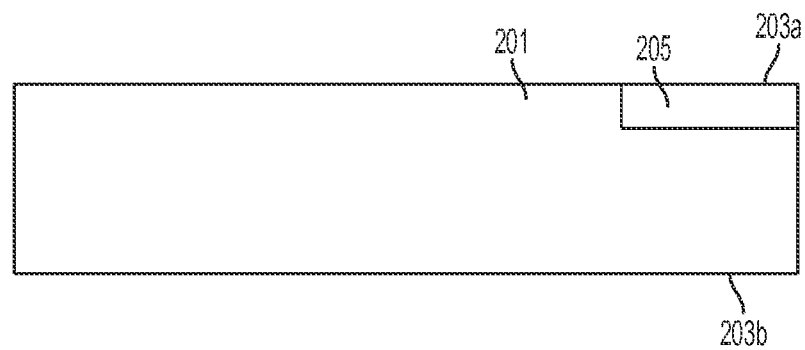
Figure 3:
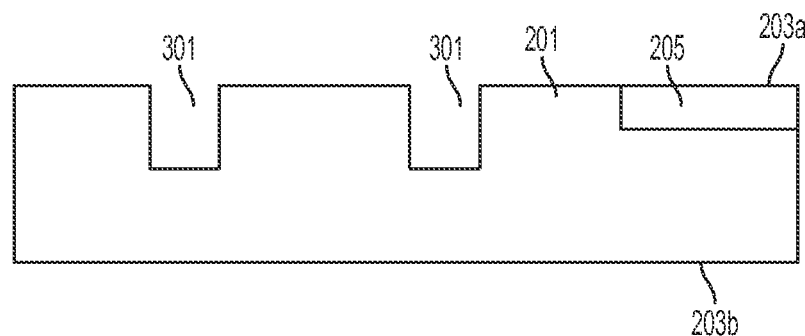

Adverting to FIG. 2, a second wafer 201 is provided with first and second surfaces 203a and 203b, respectively, and a second device layer 205, e.g., a CMOS sensor, a LED, MEMS, or a CMOS device on the first surface 203a of the second wafer 201. At least one via 301 is formed in the first surface 203a of the second wafer 201, for example by etching, as illustrated in FIG. 3.

Figure 4:
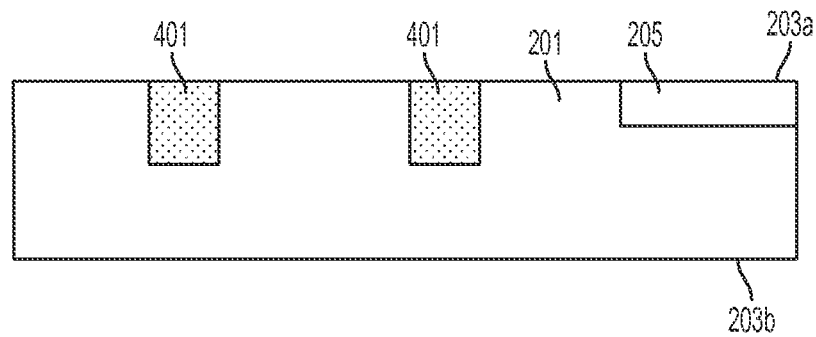

Adverting to FIG. 4, each via 301 in the second wafer 201 is then filled with a transparent alignment material 401. The specific alignment material may be selected according to the type of light used to perform the subsequent alignment process. The type of light used may range from infrared to visible to UV light. The transparent alignment material 401 may be formed from an organic material, e.g., poly(methyl methacrylate) (PMMA) based thermoplastic polymers, or an inorganic dielectric material, such as ceramic or glass. Any excess transparent alignment material 401 on surface 203a may be removed by CMP or etching of the first surface of the second wafer.

Figure 5:
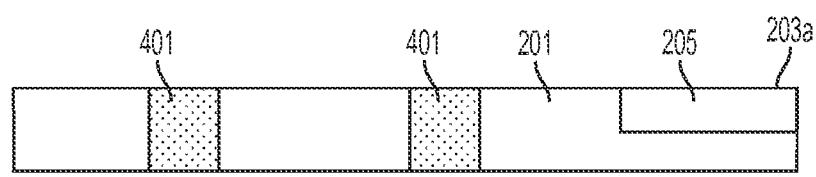
Figure 6:
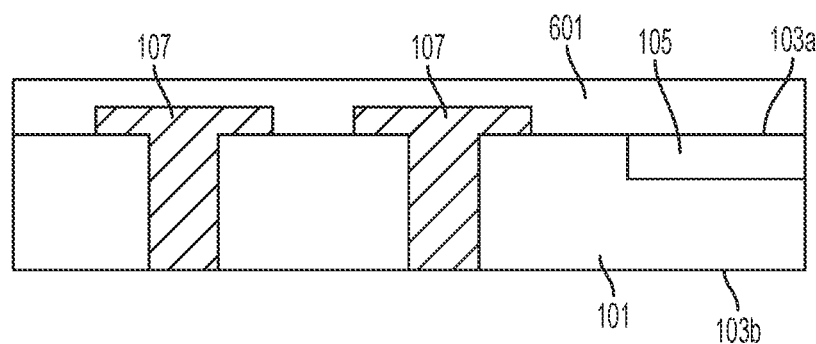

As illustrated in FIG. 5, after removing any excess transparent alignment material 401 from the first surface 203a of the second wafer 201, the second surface 203b of the second wafer 201 is thinned by mechanical grinding, CMP, or chemical or plasma etching until transparent alignment material 401 extends all the way through the second wafer 201. Subsequently, an adhesive bonding material 601, e.g., a thermosetting polymer, such as epoxy resin or polyimide, is formed on the first surface 103a of the first wafer 101, as illustrated in FIG. 6. Alternatively, the adhesive bonding material 601 may be formed on second surface 103b of the first wafer 101, on either surface 203a or 203b of the second wafer 201, or on one surface of each wafer.

Figure 7A:
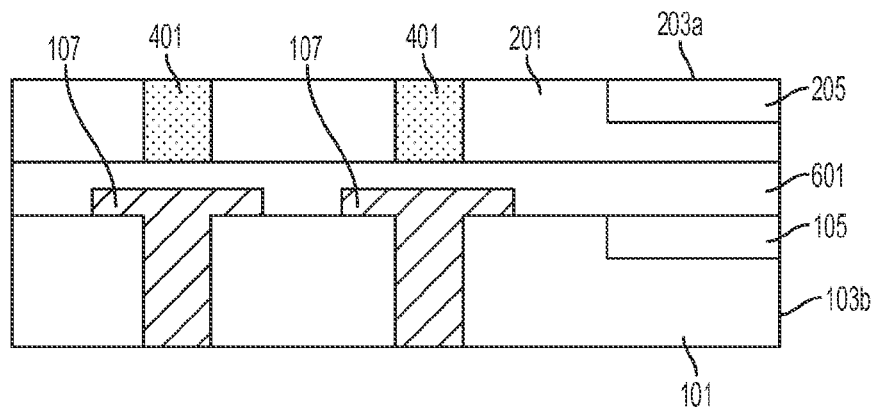
Figure 7B:
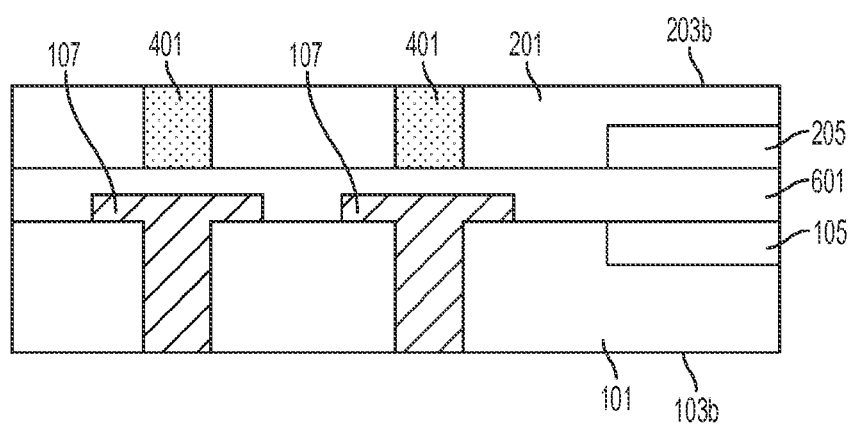

Adverting to FIGS. 7A and 7B, each TSV 103 filled with a conductive material in the first wafer 101 is aligned with the transparent alignment material 401 in the second wafer 201, for example by shining infrared, visible, or UV light through the alignment material. The aligned wafers 101 and 201 are then bonded by baking or curing the adhesive material, for example using an ultraviolet, thermal, or microwave process.

The wafers 101 and 201 may be aligned and bonded face-to-back as illustrated in FIG. 7A, or face-to-face as illustrated in FIG. 7B.

Figure 8A:
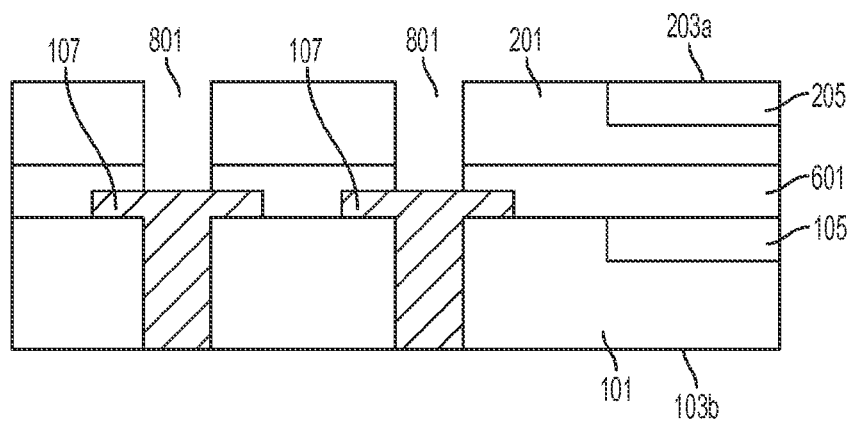
Figure 8B:
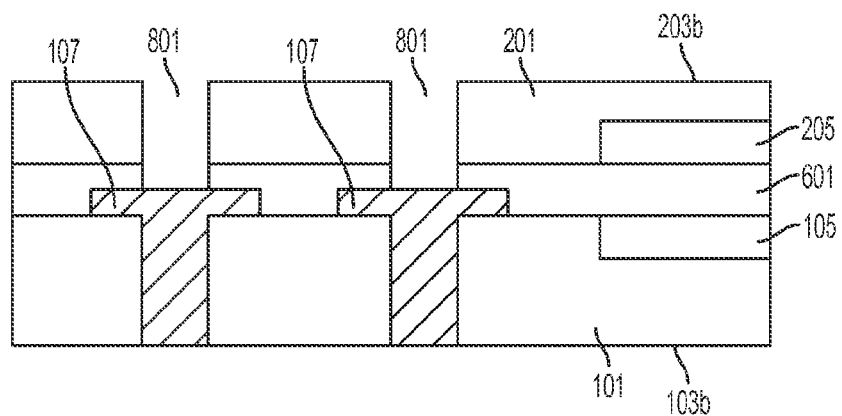

After the wafers 101 and 201 have been bonded, the transparent alignment material 401 and the adhesive bonding material 601 within the TSVs 801 may be removed by an etching process, as illustrated in FIGS. 8A and 8B. The exposed portion of each TSV 103 filled with conductive material in the first wafer 101 may then cleaned by dHF.

Figure 9A:
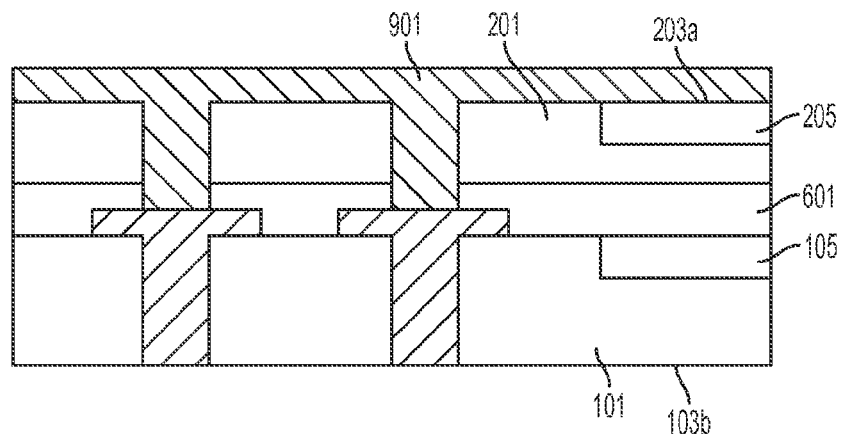
Figure 9B:
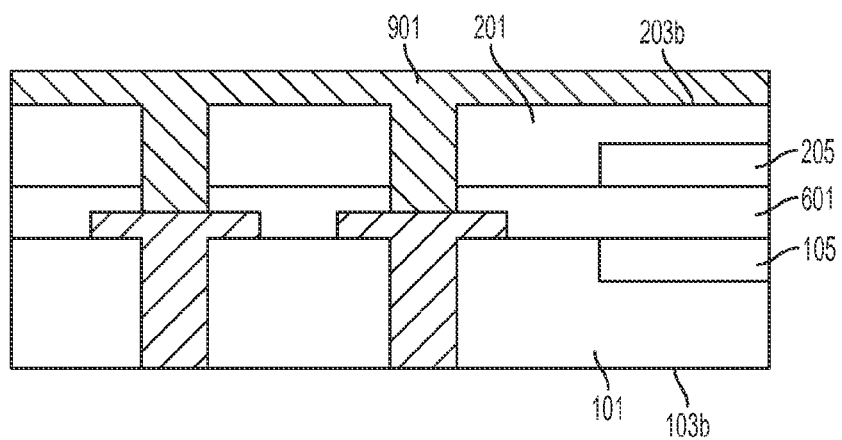

Adverting to FIGS. 9A and 9B, a liner (not shown for illustrative convenience) is formed in each TSV 801. A diffusion barrier layer and a seed layer (neither shown for illustrative convenience) may be blanket deposited over wafer 201, covering the outer surface 203a or 203b, respectively, and each TSV 801 of the second wafer 201, followed by a layer 901 of conductive material, e.g., Cu or Cu alloy, formed, for example, by Cu ECP the outer surface of and in each TSV 801 of the second wafer 201.

Figure 10A:
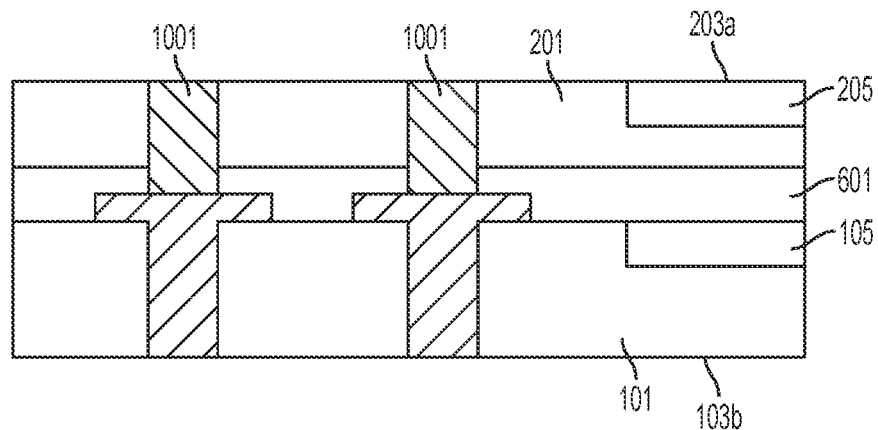
Figure 10B:
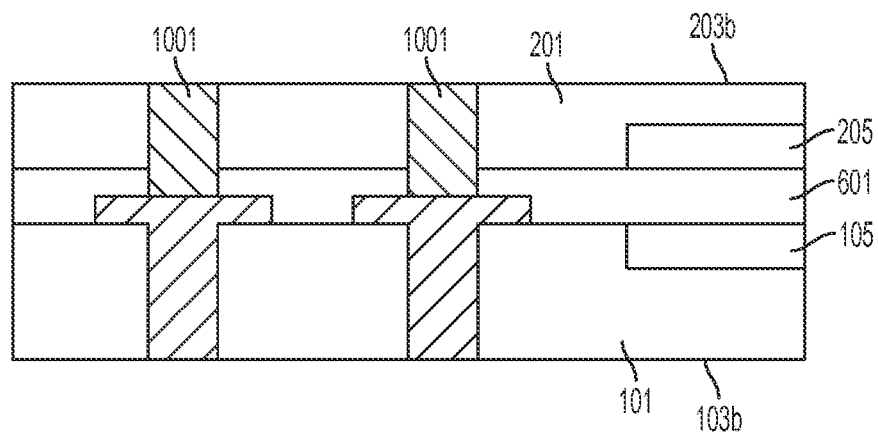

The excess conductive material of layer 901 is removed, for example by CMP, as illustrated in FIGS. 10A and 10B. The CMP process is stopped on a passivation layer (not shown for illustrative convenience) on the first or second surface 203a or 203b of the second wafer 201, respectively, resulting in a precision aligned electrical interconnection 1001 between the wafers 101 and 201. Additional wafers may be prepared according to the steps associated with FIGS. 2 through 5 and then bonded to wafer 201 according to the steps of FIGS. 6 through 10B to form a 3D IC stack.

The embodiments of the present disclosure can achieve several technical effects, including improved alignment, bonding strength, electrical interconnection, and manufacturability of 3D IC stacks compared to current bonding processes. The present disclosure enjoys industrial applicability in any of various types of 3D IC stack devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a first wafer having first and second surfaces, a first device layer, and at least one first through-silicon-via (TSV) filled with a conductive material;
   providing a second wafer having first and second surfaces and a second device layer on the first surface of the second wafer;
   forming at least one second TSV in the first surface of the second wafer;
   filling each second TSV in the second wafer with an alignment material;
   thinning the second surface of the second wafer;
   aligning the first and second wafers;
   bonding the first and second wafers;
   removing the alignment material from the second wafer; and
   filling each second TSV in the second wafer with a conductive material.

2. The method according to claim 1, comprising forming the at least one second TSV in the first surface of the second wafer by etching.

3. The method according to claim 1, comprising filling each second TSV in the second wafer with an alignment material transparent to at least one of infrared, visible, and ultraviolet (UV) light.

4. The method according to claim 3, comprising filling by:
   forming a layer of the alignment material; and
   chemical mechanical polishing (CMP) down to the first surface of the second wafer.

5. The method according to claim 3, comprising filling by:
   forming a layer of the alignment material; and
   etching down to the first surface of the second wafer.

6. The method according to claim 1, comprising thinning the second surface of the second wafer until the alignment material extends all the way through the second wafer.

7. The method according to claim 1, comprising bonding the first and second wafers by forming an adhesive bonding layer on at least one surface of the first or second wafer.

8. The method according to claim 7, comprising aligning each first TSV in the first wafer with a corresponding second TSV filled with the transparent alignment material in the second wafer.

9. The method according to claim 8, comprising removing the alignment material in the second wafer and the adhesive bonding layer by etching to expose each first TSV filled with conductive material in the first wafer.

10. The method according to claim 9, comprising cleaning with dilute hydrofluoric acid (dHF) each exposed TSV filled with conductive material in the first wafer subsequent to removing the alignment material and adhesive bonding layer.

11. The method according to claim 1, comprising filling each second TSV in the second wafer with copper.

12. The method according to claim 1, comprising forming by electrochemical plating (ECP) a layer of conductive material on an outer surface of and in each second TSV of the second wafer.

13. The method according to claim 12, comprising chemical mechanical polishing (CMP) down to the outer surface of the second wafer.

14. A method comprising:
   providing a first wafer having first and second surfaces, a first device layer, and at least one first through-silicon-via (TSV) filled with a conductive material;
   providing a second wafer having first and second surfaces, a second device layer, and at least one second TSV corresponding to the at least one first TSV of the first wafer, the at least one second TSV having no electrically conductive material;
   aligning each first TSV in the first wafer with the corresponding second TSV in the second wafer;
   bonding the first and second wafers; and
   electrically interconnecting the first and second wafers through the at least one first and the at least one second TSVs.

15. The method according to claim 14, comprising providing a first wafer having at least two first TSVs filled with a conductive material and a second wafer having at least two second TSVs, the at least two second TSVs having no electrically conductive material.

16. The method according to claim 14, wherein the at least two second TSVs are filled with an alignment material transparent to at least one of infrared, visible, and ultraviolet (UV) light, and the method further comprising removing the transparent alignment material subsequent to bonding.

17. The method according to claim 14, comprising forming an adhesive bonding layer on at least one surface of the first or second wafer.

18. The method according to claim 14, comprising forming by electrochemical plating (ECP) a layer of conductive material on an outer surface and in each second TSV in the second wafer and further comprising removing by chemical mechanical polishing (CMP) any excess conductive material from the outer surface of the second wafer.

19. A method comprising:
  providing a first wafer having first and second surfaces, a first device layer, and at least two through-silicon-vias (TSVs) filled with copper;
  providing at least two second wafers, each having first and second surfaces and a second device layer on the first surface of the at least two second wafers;
  etching at least two second TSVs in the first surface of each second wafers;
  filling each second TSV in each second wafer with an alignment material which is transparent to at least one of infrared, visible, and ultraviolet (UV) light;
  thinning the second surface of each second wafer until the alignment material extends all the way through the wafer;
  aligning the first TSVs in the first wafer with the second TSVs in one second wafer;
  bonding the first wafer and the one second wafer with an adhesive bonding material;
  etching the alignment and bonding materials through the second TSVs of the one second wafer, to expose the filled first TSVs of the first wafer;
  filling the second TSVs in the one second wafer with copper; and
  repeating for each additional second wafer the steps comprising:
  aligning the second TSVs in the bonded second wafer with the second TSVs in an additional second wafer;
  bonding further the bonded second wafer with the additional second wafer;
  etching the alignment and bonding material in the second TSVs of the additional second wafer thereby exposing the filled second TSVs of the bonded second wafer; and
  filling the second TSVs of the additional second wafer with copper.

* * * * *